US011018394B2

(12) United States Patent
Blaha et al.

(10) Patent No.: US 11,018,394 B2
(45) Date of Patent: May 25, 2021

(54) TOP LOADING BATTERY HOLDER

(71) Applicant: Memory Protection Devices, Inc., Farmingdale, NY (US)

(72) Inventors: Thomas Blaha, Garden City, NY (US); Charles Engelstein, New York, NY (US)

(73) Assignee: MEMORY PROTECTION DEVICES, INC., Farmingdale, NY (US)

( * ) Notice: Subject to any disclaimer, the term of this patent is extended or adjusted under 35 U.S.C. 154(b) by 75 days.

(21) Appl. No.: 16/414,529

(22) Filed: May 16, 2019

(65) Prior Publication Data
US 2019/0273229 A1    Sep. 5, 2019

Related U.S. Application Data

(63) Continuation of application No. 15/404,006, filed on Jan. 11, 2017, now Pat. No. 10,333,116.

(51) Int. Cl.
| *H01M 50/20* | (2021.01) |
| *H01M 10/42* | (2006.01) |
| *H01M 50/10* | (2021.01) |
| *H01M 50/216* | (2021.01) |

(52) U.S. Cl.
CPC ......... *H01M 50/20* (2021.01); *H01M 10/425* (2013.01); *H01M 50/10* (2021.01); *H01M 50/216* (2021.01)

(58) Field of Classification Search
CPC ........ H01M 2/1022; H01M 2/10; H01M 2/02; H01M 2/1038; H01M 10/425
See application file for complete search history.

(56) References Cited

U.S. PATENT DOCUMENTS

| 5,528,460 | A  | 6/1996  | Byrd |
| 6,062,901 | A  | 5/2000  | Liu et al. |
| 6,600,525 | B1 | 7/2003  | Sawai et al. |
| 7,118,817 | B2 | 10/2006 | Bartholf et al. |
| 7,217,153 | B2 | 5/2007  | Sugimoto et al. |
| 7,448,904 | B2* | 11/2008 | Darr .................... H01M 2/1038 439/500 |
| 7,591,672 | B2 | 9/2009  | Wu |
| 7,641,509 | B2 | 1/2010  | Shen et al. |
| 9,192,059 | B2 | 11/2015 | Blaha et al. |

(Continued)

FOREIGN PATENT DOCUMENTS

CN    205122670    3/2016

OTHER PUBLICATIONS

International Search Report and Written Opinion, Israel Patent Office, co-pending Application No. PCT/US2018/013292, dated May 6, 2018.

*Primary Examiner* — Stewart A Fraser
(74) *Attorney, Agent, or Firm* — Gotlieb, Rackman & Reisman PC

(57) ABSTRACT

A top loading battery holder that is arranged in direct contact with a surface (e.g., circuit board) to allow for a battery to be arranged directly within the holder and in electrical contact with the surface. The battery holder can include a housing that is configured to at least substantially surround a battery that is arranged therein and a plurality of a flanges and/or protrusions that are configured to extend inwardly from the housing to aid in securing the battery within the housing.

6 Claims, 11 Drawing Sheets

(56) References Cited

U.S. PATENT DOCUMENTS

| | | |
|---|---|---|
| 9,263,716 B2 | 2/2016 | Szoke et al. |
| 2004/0241542 A1 | 12/2004 | Nakamura et al. |
| 2010/0059644 A1 | 3/2010 | Sun |
| 2014/0232348 A1 | 8/2014 | Szoke et al. |
| 2016/0133839 A1 | 5/2016 | Li et al. |

* cited by examiner

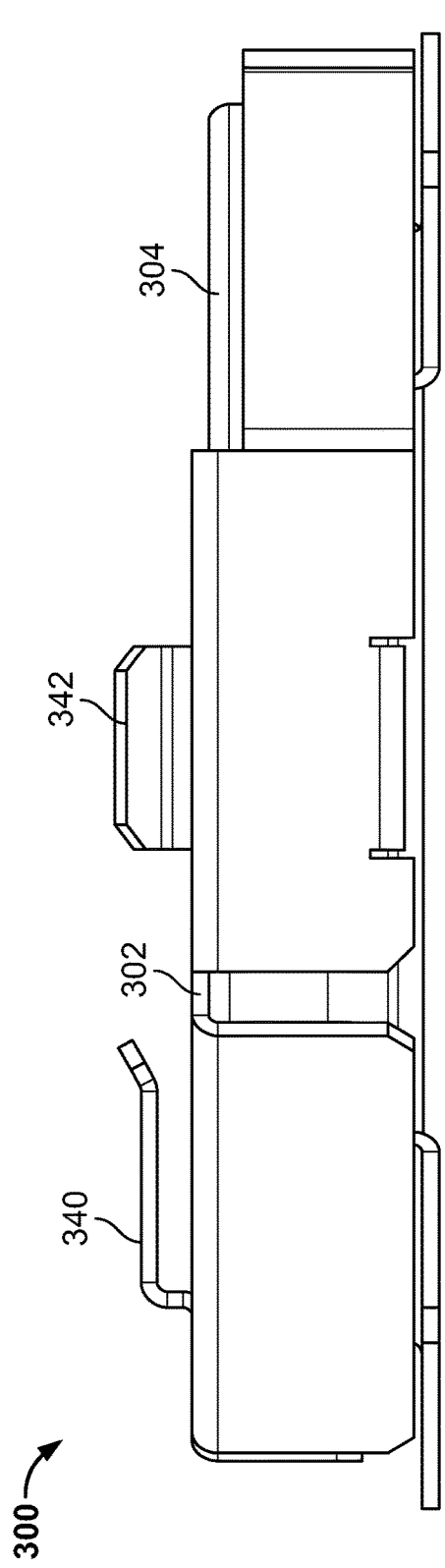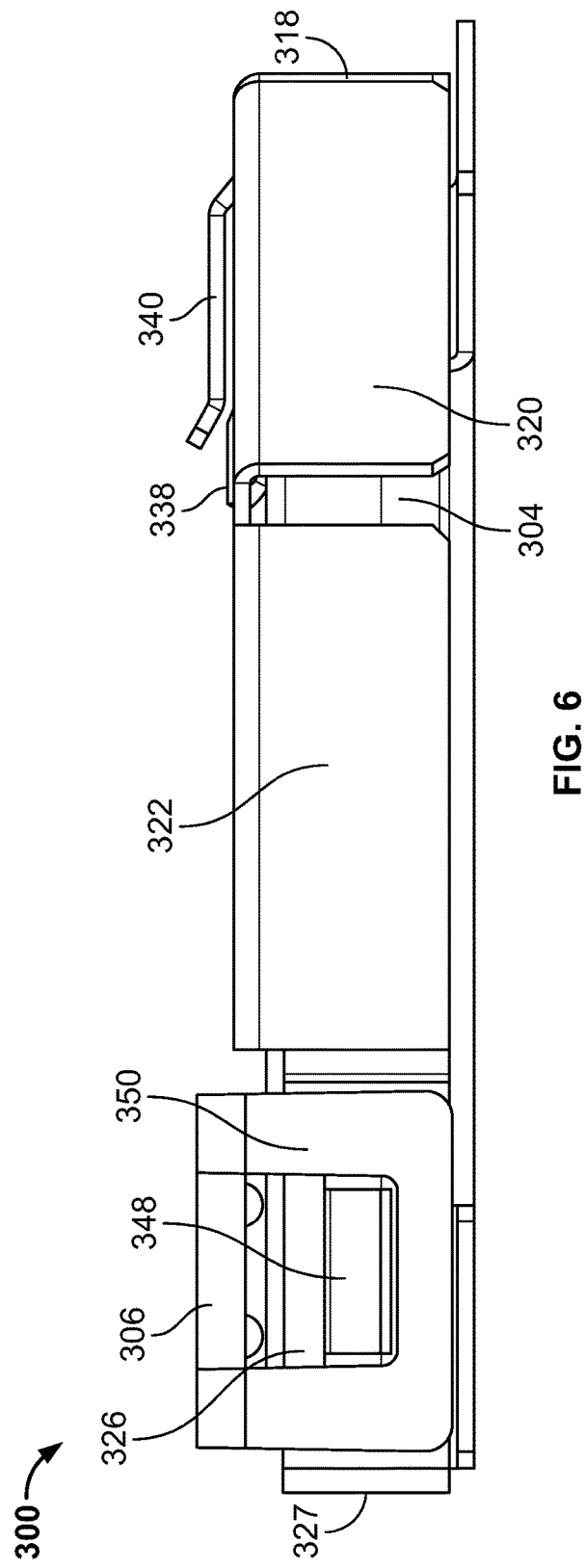

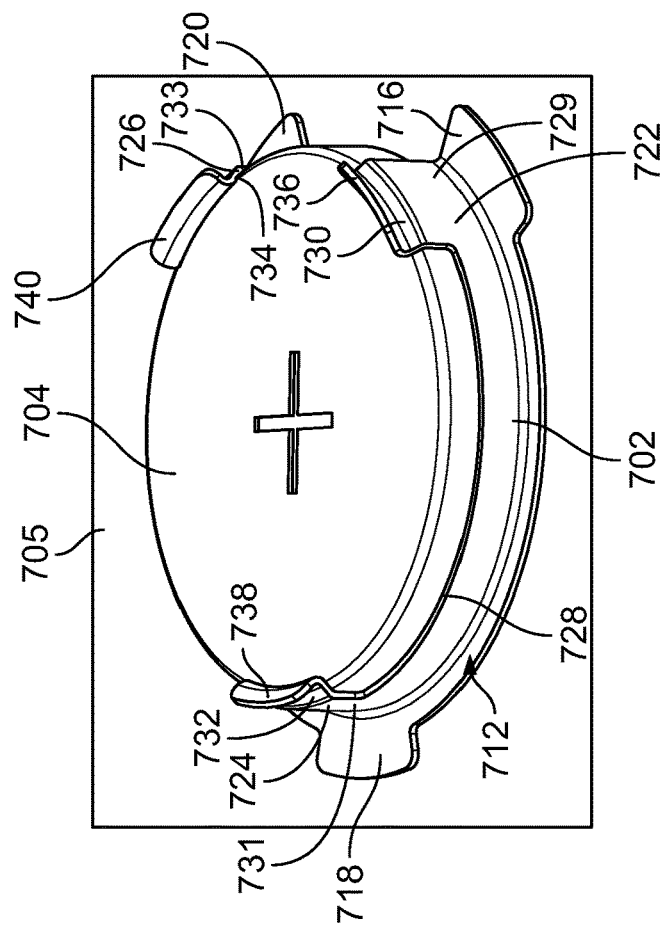
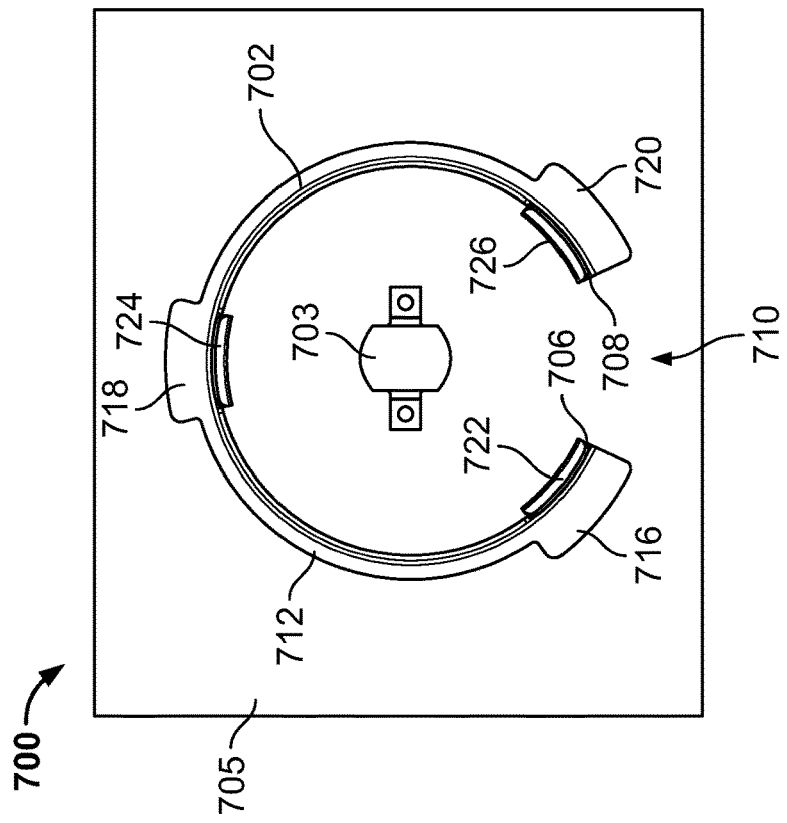
FIG. 14
FIG. 13

TOP LOADING BATTERY HOLDER

CROSS-REFERENCE TO RELATED APPLICATION

This patent application claims benefit to U.S. patent application Ser. No. 15/404,006, filed Jan. 11, 2017, which is hereby incorporated by reference in its entirety as part of the present disclosure.

FIELD OF THE INVENTION

This invention relates generally to a battery holder and more specifically to a top loading battery holder that is positionable directly on a surface of an object (e.g., a printed circuit board) and that is configured to allow a battery to be received directly therein or removed therefrom.

BACKGROUND OF THE INVENTION

Devices that utilize a battery regularly require an apparatus to fix the battery in a desired position in order to maintain an electrical connection between the battery and the device. In many instances, the device includes a circuit board.

Commonly, battery holders, including side loading battery holders and top loading battery holders, are connected to a circuit board to place a battery in electrical connection with the circuit board. However, these battery holders typically require a substantial amount of space on a surface of a circuit board and, as is the case for side loading battery holders, require additional space for clearance to allow a battery to be installed and removed. This space is very valuable as other components must also be arranged on the circuit board and in many instances there is a need to keep the size of the circuit board as small as possible. Additionally, many existing battery top loading holders require a plurality of complex and cumbersome fastening and/or covering systems to ensure a battery is secured within the holder and in contact with the circuit board. As such, existing top loading battery holders are costly to produce, time consuming to assemble and can be difficult to access to remove and replace a battery when necessary due to the fastening and/or covering system used to secure the battery in the holder.

SUMMARY OF THE INVENTION

The present invention broadly is directed to a top loading battery holder that can be arranged in direct contact with a surface, including a circuit board, allowing for a battery to be easily arranged within the holder. The battery holder encompasses a minimal amount of space, requires very few components and is easy to access when necessary to install or replace a battery.

In an embodiment, the present invention is directed to a top loading battery holder that is configured to be integratable with a circuit board where the battery holder comprises a housing that substantially surrounds a battery arranged therein and at least one retention element that is configured to extend at least partially over the battery arranged in the housing and is fastenable to the housing to secure the battery within the housing. The housing can be comprised of conductive material and the retention element can be entirely transparent so as to permit viewing of the polarity of the battery and/or comprised of insulating material, such as plastic.

In an embodiment, the retention element is comprised of a first leg, a second leg that is spaced from the first leg and extends substantially parallel to the first leg and a third leg extending transverse between the first leg and the second leg. The retention element can include a first opening that extends between the first leg and the third leg and a second opening that extends between the second leg and the third leg. The retention element can further include a first tab extending at an angle from an inner surface of the first leg and a second tab extending at an angle from an inner surface of the second leg.

In an embodiment, the housing can include a sidewall with at least a first opening that is configured to receive the first tab of the retention element and a second opening that is configured to receive the second tab of the retention element to fix the retention element to the housing. Alternatively, the housing can include a plurality of tabs extending outwardly and that are configured to fix the retention element to the housing arranging one of the tabs in the first opening and another of the tabs in the second opening.

In an embodiment, the housing can include a plurality of sidewalls that extend at angles from each other and a plurality of flanges extending from the sidewalls for mounting of the housing to the circuit board. The housing can include seven sidewalls that extend at angles from each other to substantially surround the battery. The sidewalls can include a first end and a second end that includes a flange extending inwardly from a plurality of the sidewalls toward a center of the housing with a plurality of elastically deformable projections extending from the flange that are contactable with the battery arranged in the housing to aid in securing the battery within the housing.

In another embodiment, the present invention relates to an apparatus for retaining a battery and transferring battery power. The apparatus comprises a mounting surface and a negative contact and a housing that are fixed to the mounting surface with the housing configured to substantially surround the battery arranged therein. The apparatus can further include a retention element configured to be fastened to the housing and at least partially secure the battery within the housing. The mounting surface to which the housing is fixed can be a circuit board. The housing can be soldered to the circuit board or electrically connected to the circuit board.

The housing can be substantially circular and can include a plurality of flanges that extend from the housing inwardly, toward the center of the housing and are configured to releasably fix the battery within the housing. The housing can include a frame defining a sidewall and a flange extending from the sidewall to stabilize the battery holder. The battery holder can be comprised of a single piece of sheet metal. Each of the flanges of the battery holder can be comprised of at least a first leg and a second leg with the first leg contoured to extend inwardly from the frame and, in an installed state, partially over the battery when the battery is arranged within the housing. The second leg is configured to extend away from the frame. In an embodiment, the flanges provide a force on a battery in an installed state.

In another embodiment, the present invention relates to a method of assembling a battery within a battery holder fixed to a circuit board that comprises the steps of providing a housing comprising at least one sidewall having a first end and a second end with an opening extending between the first and second ends, a plurality of flanges extending from the housing toward a center of the housing, inserting a coin cell battery within the housing such that the housing substantially surrounds the coin cell battery and the projections at least one of contact the coin cell battery and extend partially over the coin cell battery. In an embodiment, the method can further comprise the step of arranging a retention element over the housing and the coin cell battery and fixing the retention element to the housing to secure the coin cell battery within the housing.

BRIEF DESCRIPTION OF THE DRAWINGS

FIG. 5 is a first side view of the top loading battery holder of FIG. 3 with a battery arranged therein;

FIG. 6 is a second side view of the top loading battery holder of FIG. 3 with a battery arranged therein;

FIG. 13 is a top view of a seventh embodiment of a top loading battery holder fixed to a circuit board;

FIG. 14 is a first perspective view of the top loading battery holder of FIG. 13;

DETAILED DESCRIPTION OF EMBODIMENTS OF THE INVENTION

With reference now to the drawings, and in particular to FIGS. 1-17, embodiments of top loading battery holders embodying the principles and concepts of the present invention will be described. Each of the embodiments disclosed herein is configured to be able to be assembled to a circuit board.

Figure 1:
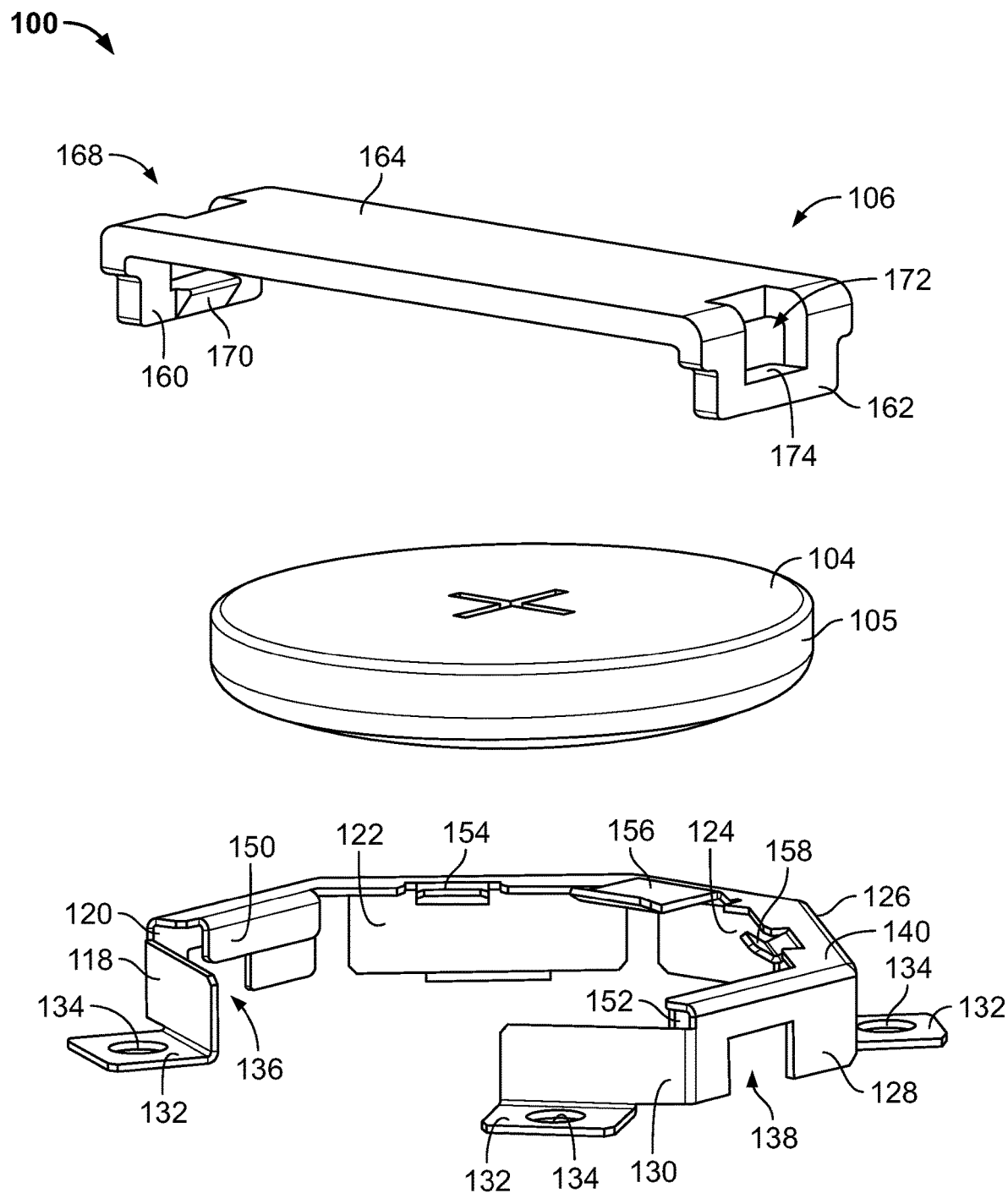
FIG. 1 is an exploded view of a first embodiment of a top loading battery holder.

FIG. 1 illustrates a first embodiment of a top loading battery holder that is designated hereinafter by reference numeral 100. The top loading battery holder 100 includes a housing 102 that is shaped to at least substantially surround a battery 104 (e.g., coin cell battery) and a retention element 106 that interacts with the housing 102 to aid in securing the battery 104 within the housing 102 by partially covering the battery 104. The housing 102, as will be described in more detail below, is fastenable to a surface (e.g., a circuit board) so that when the battery 104 is inserted into the housing 102, the housing 102 will be in direct contact with the surface.

The housing 102 includes a plurality of sidewalls that form a frame or cage to substantially surround the battery 104 when the battery 104 is arranged therein. As shown in FIG. 1, the housing 102, which includes a first sidewall 118, a second sidewall 120 extending at an angle from the first sidewall 118, a third sidewall 122 extending at an angle from the second sidewall 120, a fourth sidewall 124 extending at an angle from the third sidewall 122, a fifth sidewall 126 extending at an angle from the fourth sidewall 124, a sixth sidewall 28 extending at an angle from the fifth sidewall 126 and a seventh sidewall 130 extending at an angle from the sixth sidewall 128 that substantially surrounds the battery 104 when the battery 104 is arranged within the housing 102. Although seven sidewalls 118, 120, 122, 124, 126, 128, 130 are shown in FIG. 1, the number of sidewalls and shape of the housing 102 can vary to include any number of sidewalls that form a shape that can secure a battery 104 within the periphery formed by the sidewalls 118, 120, 122, 124, 126, 128, 130 and ensure the battery 104 is in direct contact with a surface containing an electrical contact.

To aid assembly (e.g., pick and place assembly) connecting the housing 102 to a surface, the housing 102 can include a plurality of flanges 132 that each have an opening 134 therein which extends from sidewalls of the housing 102. As shown in the embodiment in FIG. 1, the flanges 132 extend from a first end of the first sidewall 118, the third sidewall 122, the fifth sidewall 126 and the seventh sidewall 130. The flanges 132 can, for example, be electronically connected or welded to the surface. In an embodiment, the surface will have a negative conductivity and the housing 102 will provide positive conductivity for the battery 104.

As shown in FIG. 1, the second sidewall 120 and the sixth sidewall 128 each include an opening 136, 138, respectively, that is adaptable to receive and releasably fasten the retention element 106 to the housing 102 to aid in securing the battery 104 within the housing 102. To further aid in securing the battery 104 within the housing 102, a flange 140 extends continuously from a second end of the second, third, fourth, fifth and sixth sidewalls 120, 122, 124, 126, 128 inwardly toward a center of the housing 102 and a first projection 150 extends substantially perpendicular from the flange 140 at the second sidewall 120 and a second projection 152 extends substantially perpendicular from the flange 140 at the sixth sidewall 128. The projections 150, 152 are each contactable with at least a sidewall 105 of the battery 104 when the battery 104 is arranged within the housing 102. Additionally, to further aid in securing the battery 104 within the housing 102, a first flexible tab 154 extends from the third sidewall 122 toward a center of the housing 102, a second flexible tab 156 extends from the fourth sidewall 124 toward a center of the housing 102 and a third flexible tab 158 extends from the fifth sidewall 126 toward a center of the housing 102. In an embodiment, the projections 150, 152 and the tabs 154, 156, 158 are elastically deformable to allow for the battery 104 to be inserted and removed from the housing 102.

As depicted in FIG. 1, the retention element 106, as shown in FIG. 1, includes a first leg 160, a second leg 162 spaced from and extending parallel to the first leg 160 and a third leg 164 extending transverse between the first leg 160 and the second leg 162 to form a substantially U-shaped body. To connect the retention element 106 to the housing 102, a first opening 168 is formed substantially within the first leg 160, a first projection 170 extends inwardly at an angle from the distal end of the first leg 160, a second opening 172 is formed substantially within the second leg 162 and a second projection 174 extends inwardly at an angle from the distal end of the second leg 162. The first projection 170 interacts with the opening 136 formed in the second sidewall 120 of the housing 102 and the second projection 174 interacts with the opening 138 formed in the sixth sidewall 128 of the housing 102 to secure the retention element 106 to the housing 102.

In an embodiment, the retention element 106 is transparent to allow the polarity of the battery 104 to be visible through the retention element 106. In another embodiment, the retention element 106 is opaque. In yet another embodiment, the retention element 106 includes insulating material such as plastic.

Figure 2:
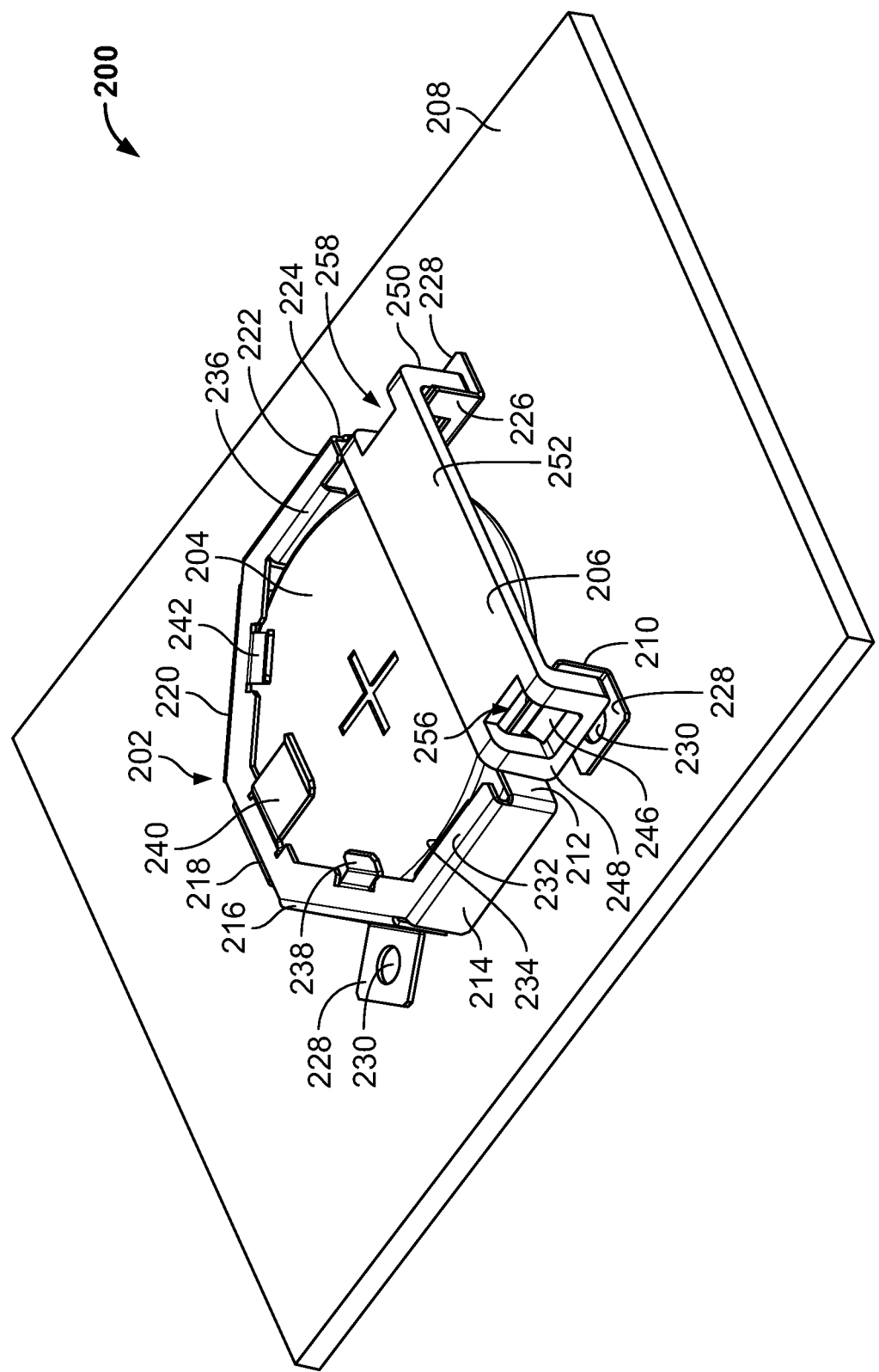
FIG. 2 is a perspective view of a second embodiment of a top loading battery holder in an assembled state fixed to a circuit board.

FIG. 2 illustrates a second embodiment of a top loading battery holder that is designed hereinafter by reference numeral 200. The top loading battery holder 200 includes a housing or cage 202 that is mountable to a surface (e.g., circuit board) 208 and is shaped to at least substantially surround a battery 204 (e.g., coin cell battery) and a retention element 206 that interacts with the housing 202 and partially covers the battery 204 to aid in securing the battery 204 within the housing 202. As shown in FIG. 2, the battery holder 200 is mounted to a circuit board 208.

The housing or cage 202 comprises a plurality of sidewalls including a first sidewall 210, a second sidewall 212 extending substantially perpendicular from the first sidewall 210, a third sidewall 214 extending substantially perpendicular from the second sidewall 212, a fourth sidewall 216 extending at an angle from the third sidewall 214, a fifth sidewall 218 extending at an angle from the fourth sidewall 216, a sixth sidewall 220 extending at an angle from the fifth sidewall 218, a seventh sidewall 222 extending at an angle from the sixth sidewall 220, an eighth sidewall 224 extending at an angle from and substantially perpendicular to the seventh sidewall 222 and a ninth sidewall 226 extending at an angle from and substantially perpendicular to the eighth sidewall 224. As can be seen in FIG. 2, the first sidewall 210, the second sidewall 212, the third sidewall 214 and the fourth sidewall 216 are mirror opposite the sixth sidewall 220, the seventh sidewall 222, the eighth sidewall 224 and the ninth sidewall 226.

As illustrated in FIG. 2, to mount the housing 202 to the circuit board 208, the housing 202 comprises a plurality of flanges 228 that each include an opening 230 therein and that extend from the first sidewall 210, the fourth sidewall 216, the sixth sidewall 220 and the ninth sidewall 226. The flanges 228 can fix the housing 202 to the circuit board 208 by any known manner including, but not limited to, electronically connecting or welding the housing 202 to the circuit board 208.

To aid in securing the battery 204 within the housing 202, a flange 232 extends inwardly toward a center of the housing 202 from the third, fourth, fifth, sixth and seventh sidewalls 214, 216, 218, 220, 222. A first projection 234 extends substantially perpendicular from the flange 232 at the third sidewall 214 and a second projection 236 extends substantially perpendicular from the flange 232 at the seventh sidewall 222. The projections 234, 236 are each contactable with at least a sidewall of the battery 204 when the battery 204 is arranged within the housing 202 to aid in securing the battery 204 within the housing 202. Additionally, the housing 202 includes a first flexible tab 238 that extends from the fourth sidewall 216, a second tab 240 that extends from the fifth sidewall 218 and a third tab 242 that extends from the sixth sidewall 220 to extend partially over a top surface of the battery 204 when the battery 204 is arranged within the housing 202. Each of the projections 234, 236 and tabs 238, 240, 242 are elastically deformable to allow for the battery 204 to be easily inserted and removed from the housing 202.

The housing 202 can also include a first sidewall projection 244 that extends outwardly from the first sidewall 210 and a ninth sidewall projection (not shown) that extends outwardly from the ninth sidewall 226 to aid in releasably fastening the retention element 206 to the housing 202.

In an embodiment, the retention element 206 is transparent to allow the polarity of the battery 204 to be visible through the retention element 206. In another embodiment, the retention element 206 is opaque. In yet another embodiment, the retention element 206 includes insulating material.

As shown in FIG. 2, the retention element 206 includes a first leg 248, a second leg 250 spaced from and extending parallel to the first leg 248 and a third leg 252 extending transverse between the first leg 248 and the second leg 250 to form a substantially U-shaped body. The retention element 206 includes a first opening 256 that is formed substantially within the first leg 248 and a second opening 258 that is formed substantially within the second leg 250 in which the first projection 244 and the second projection, respectively, can be arranged.

FIGS. 3-7 illustrate a third embodiment of a top loading battery holder that is designed hereinafter by reference numeral 300. The battery holder 300 is substantially similar to top loading battery holder 200 of the second embodiment and depicted in FIG. 2 except that housing 302 of the battery holder 300 of the third embodiment is entirely enclosed so as to fully surround the battery 304 when the battery 304 is arranged therein. As such, like reference numerals used to describe features of the battery holder 200 of the second embodiment will be used to indicate features of the battery holder 300 of the third embodiment.

Figure 3:
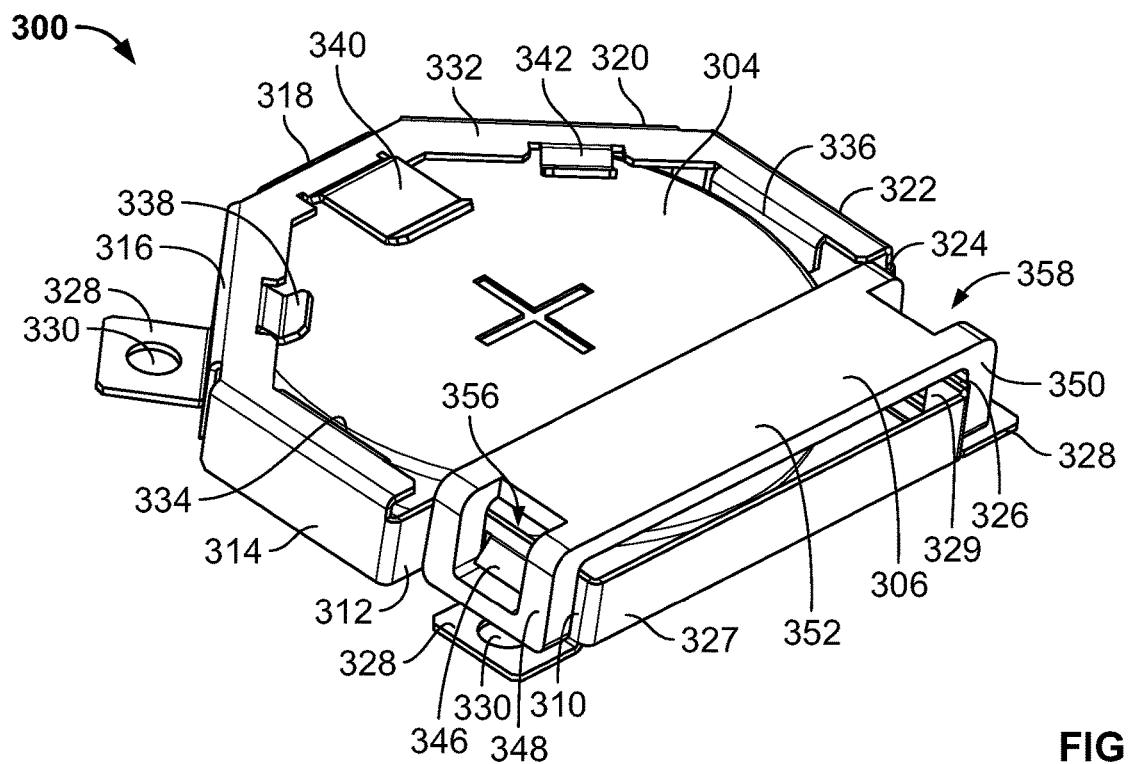
FIG. 3 is a perspective view of a third embodiment of a top loading battery holder with a battery arranged therein.
Figure 4:
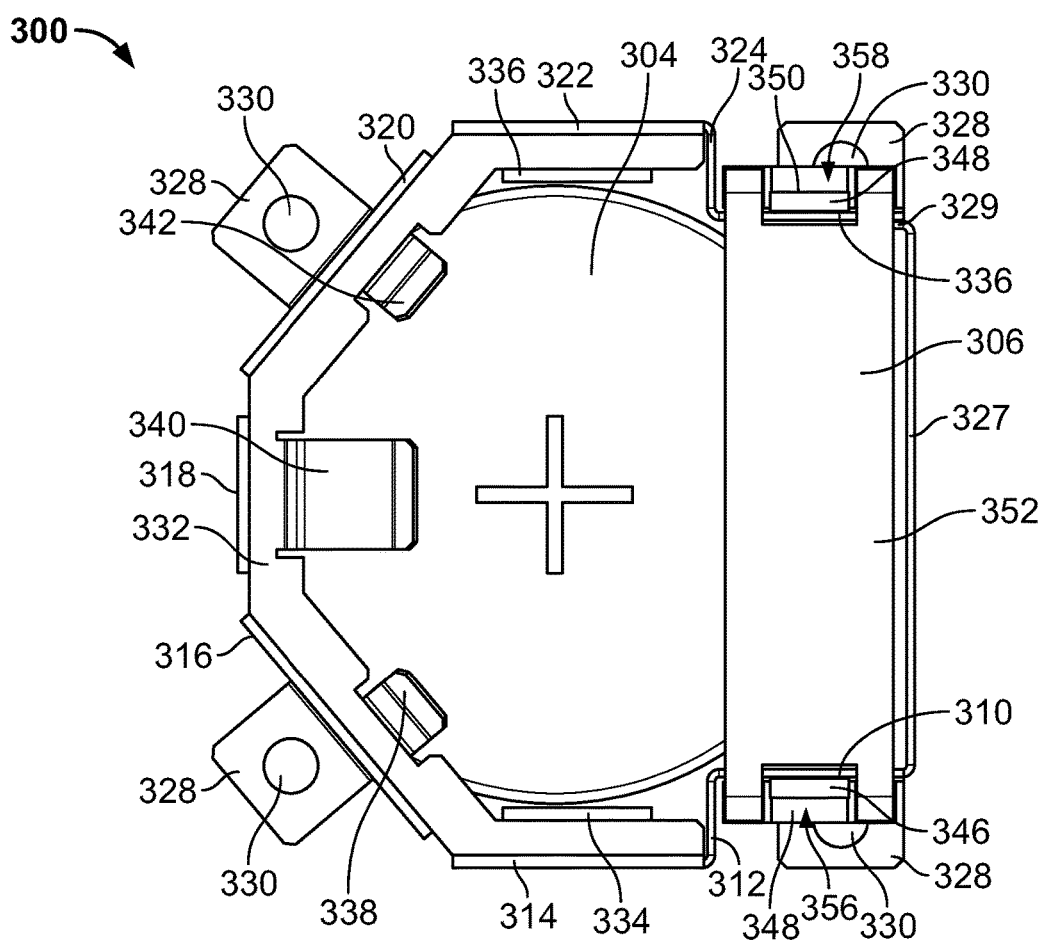
FIG. 4 is a top view of the top loading battery holder of FIG. 3 with a battery arranged therein.
Figure 7:
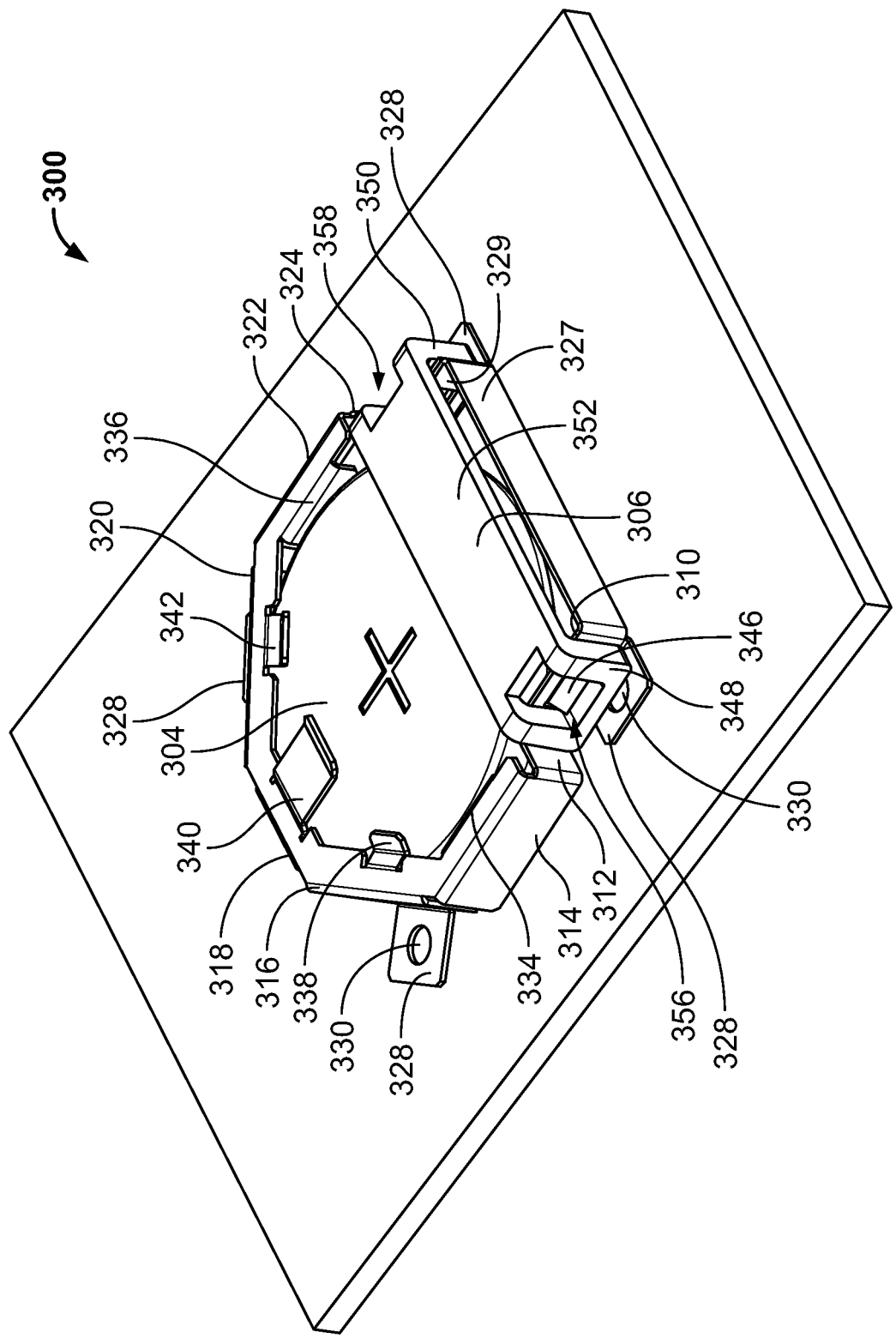
FIG. 7 is a perspective view of the top loading battery holder of FIG. 3 fixed to a circuit board with a battery arranged therein.

As can be seen in FIGS. 3, 4 and 7, the housing includes ten sidewalls with the tenth sidewall 327 extending between the first sidewall 310 and the ninth sidewall 326 and a tab 329 that extends perpendicular from the tenth sidewall 327 and contacts the ninth sidewall 326.

Figure 8:
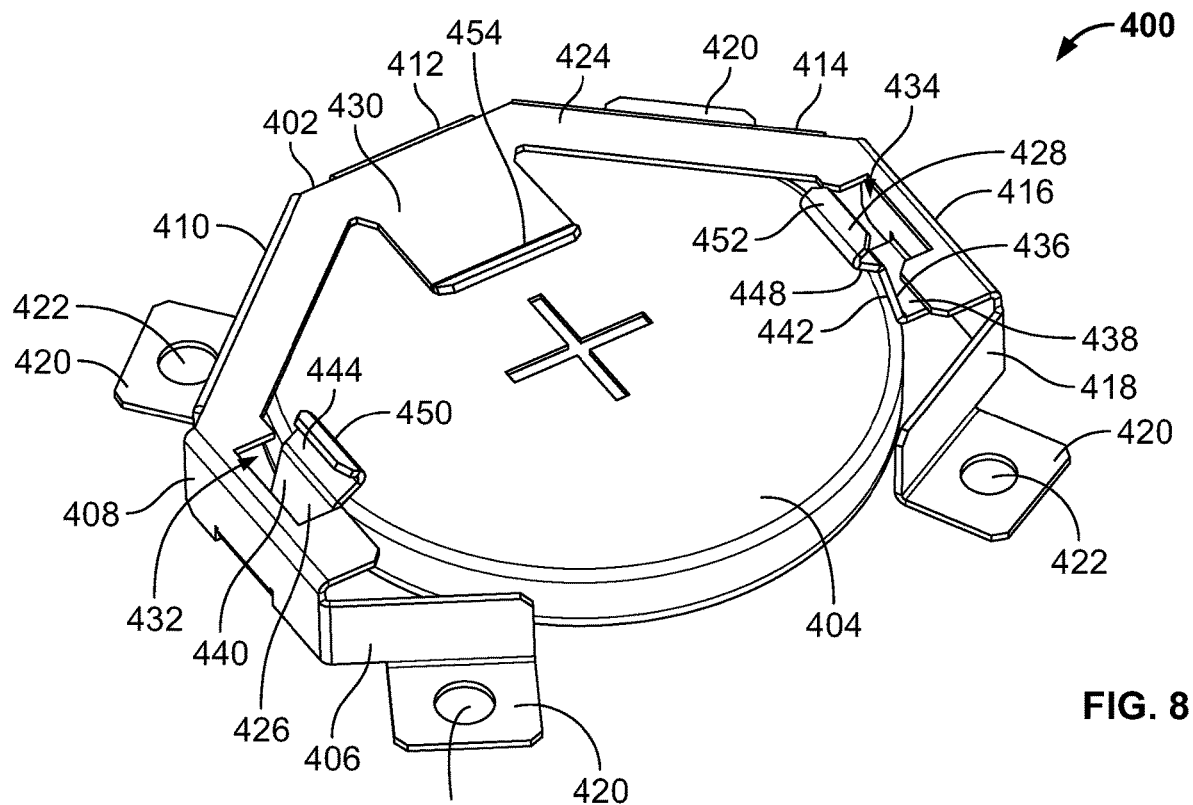
FIG. 8 is a perspective view of a fourth embodiment of a top loading battery holder.

FIG. 8 illustrates a fourth embodiment of a top loading battery holder that is designed hereinafter by reference numeral 400. The battery holder 400 is substantially similar to the first embodiment of a battery holder 100 with the difference being the way a battery is releasably fixed within the battery holder. The top loading battery holder 400 includes a housing 402 that is fastenable to a surface (not shown) and is shaped to secure the battery [[204]]404 within the battery holder 400.

As shown in FIG. 8, the top loading battery holder 400 includes a housing 402 that is fastenable to a surface and is shaped to secure the battery 404 within the battery holder 400. The housing 402 includes a plurality of sidewalls that form a frame or cage to at least substantially surround the battery 404. Specifically, the housing 402 includes a first sidewall 406, a second sidewall 408 that extends at an angle from the first sidewall 406, a third sidewall 410 that extends at an angle from to the second sidewall 408, a fourth sidewall 412 that extends at an angle from the third sidewall 410, a fifth sidewall 414 that extends at an angle from the fourth sidewall 412, a sixth sidewall 416 that extends at an angle from the fifth sidewall 414 and a seventh sidewall 418 that extends at an angle from the sixth sidewall 416. The housing 402 as shown in FIG. 8 is substantially octagonal in shape with the battery 404 protruding between the first sidewall 406 and the seventh sidewall 418. However, the number of sidewalls and shape can include any number of sidewalls and shape that would secure the battery 404 to a surface, such as a circuit board.

To aid in connecting the housing 402 to a surface, the housing 402, as shown in an embodiment in FIG. 8, can include a plurality of flanges 420 that each have an opening 422 therein, which extend from the first sidewall 406, the third sidewall 410, the fifth sidewall 414 and the seventh sidewall 418. The flanges 420 can connect the housing 402 to a surface in any known matter. For example, the flanges 420 can be welded or electronically connected to such surface as a circuit board.

To releasably secure the battery 404 within the housing 402, a flange 424 extends from a second end 405 of the second sidewall 408, the third sidewall 410, the fourth sidewall 412, the fifth sidewall 414 and the sixth sidewall 416 inwardly toward a center of the housing 402. At least the portions of the flange 424 extending from the third sidewall 410, the fourth sidewall 412 and the fifth sidewall 414 can partially extend over the battery 404 to aid in securing the battery within the housing 402.

To further aid in securing the battery 404 within the housing 402, the housing 402 includes a first flexible projection 426, a second flexible projection 428 and a third flexible projection 430 that each extend inwardly toward a center of the housing 402 so as to be contactable with and can at least partially extend over the battery 404 when the battery 404 is installed in the housing 402.

As depicted in FIG. 8, the first flexible projection 426 extends upwardly from the second sidewall 408 through a cutout 432 formed in a portion of the flange 424 and the second flexible projection 428, which is diametrically opposed to the first flexible projection 426, extends upwardly from the sixth sidewall 416 through a cutout 434 formed in a portion of the flange 424 extending from the sixth sidewall 416. Both the first flexible projection 426 and the second flexible projection 428 are comprised of a plurality of segments that include, respectively, a first segment 436, 438, a second segment 440, 442 that extends upwardly at a first angle from the first segment 436, 438, a third segment 444, 448 that extends at a second angle from the second segment 440, 442 and a fourth segment 450, 452 that extends at a third angle, away from the housing 402. The fourth segment 450, 452 aids to release and secure the battery 404 within the housing 402 by allowing for temporary deformation of the flexible projection 426, 428 away from the center of the housing 402 when the battery 404 is inserted and removed from the housing 402. The third flexible projection 430 extends substantially linearly from the fourth sidewall 412 of the housing 402 and includes a segment 454 extending away from the housing 402 to allow for temporary deformation when the battery 404 is inserted and removed from the housing 402.

Figure 9:
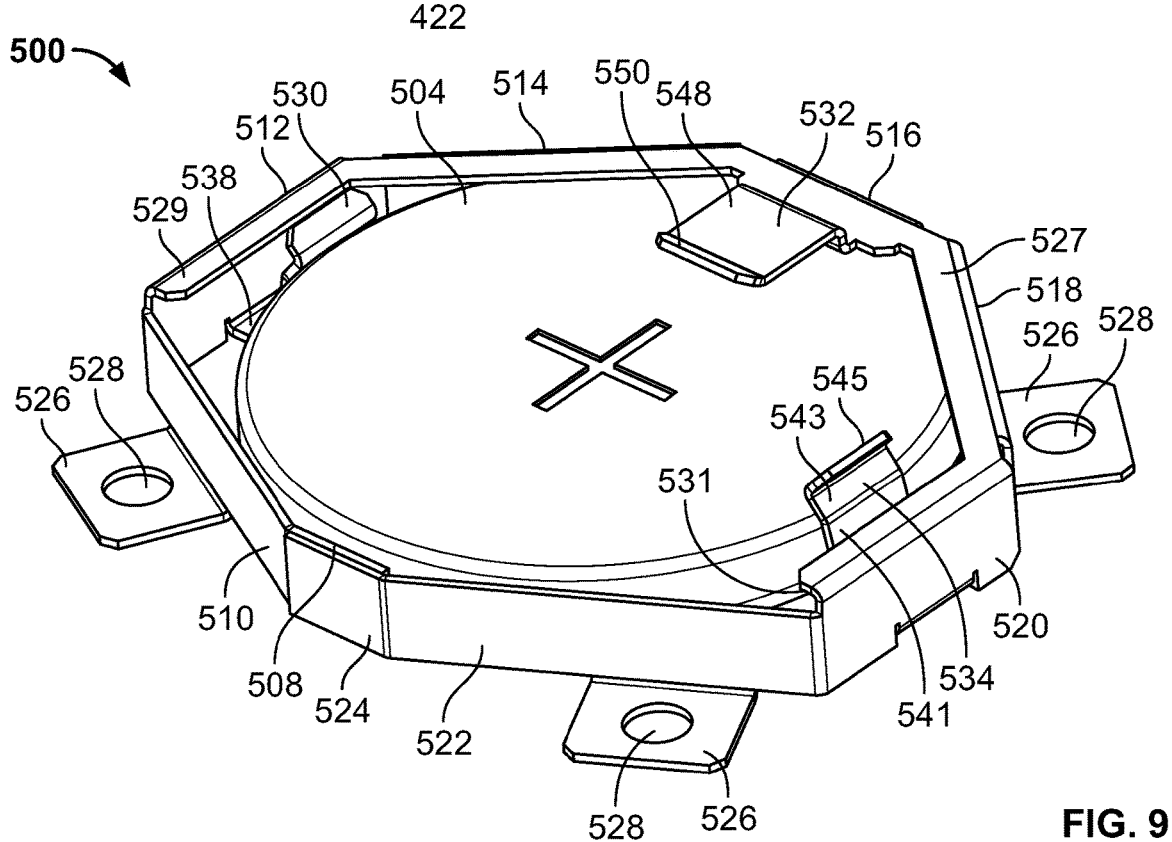
FIG. 9 is a perspective view of a fifth embodiment of a top loading battery holder with a battery arranged therein.
Figure 10:
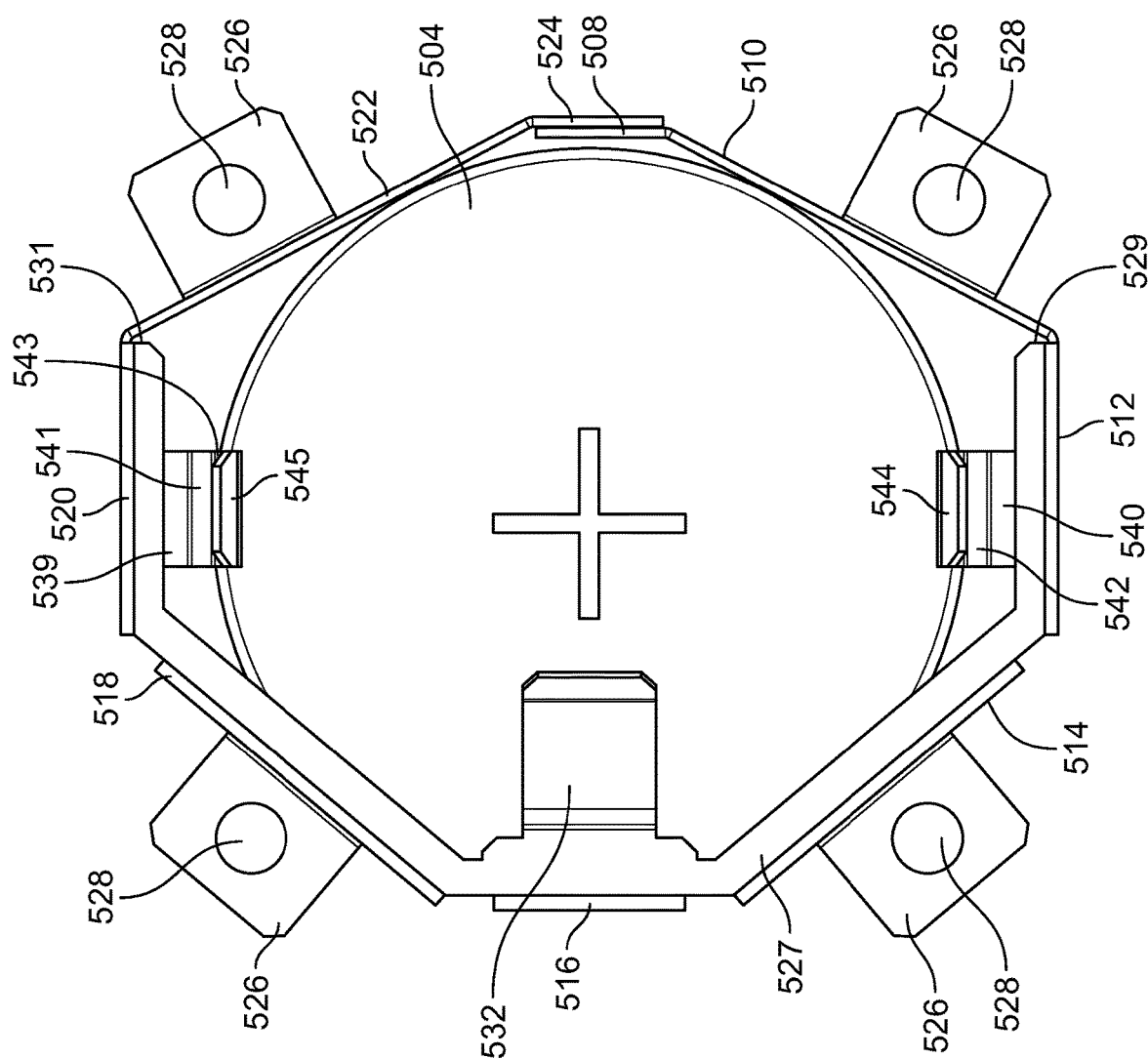
FIG. 10 is a top view of the top loading battery holder of FIG. 9 with a battery arranged therein.
Figure 11:
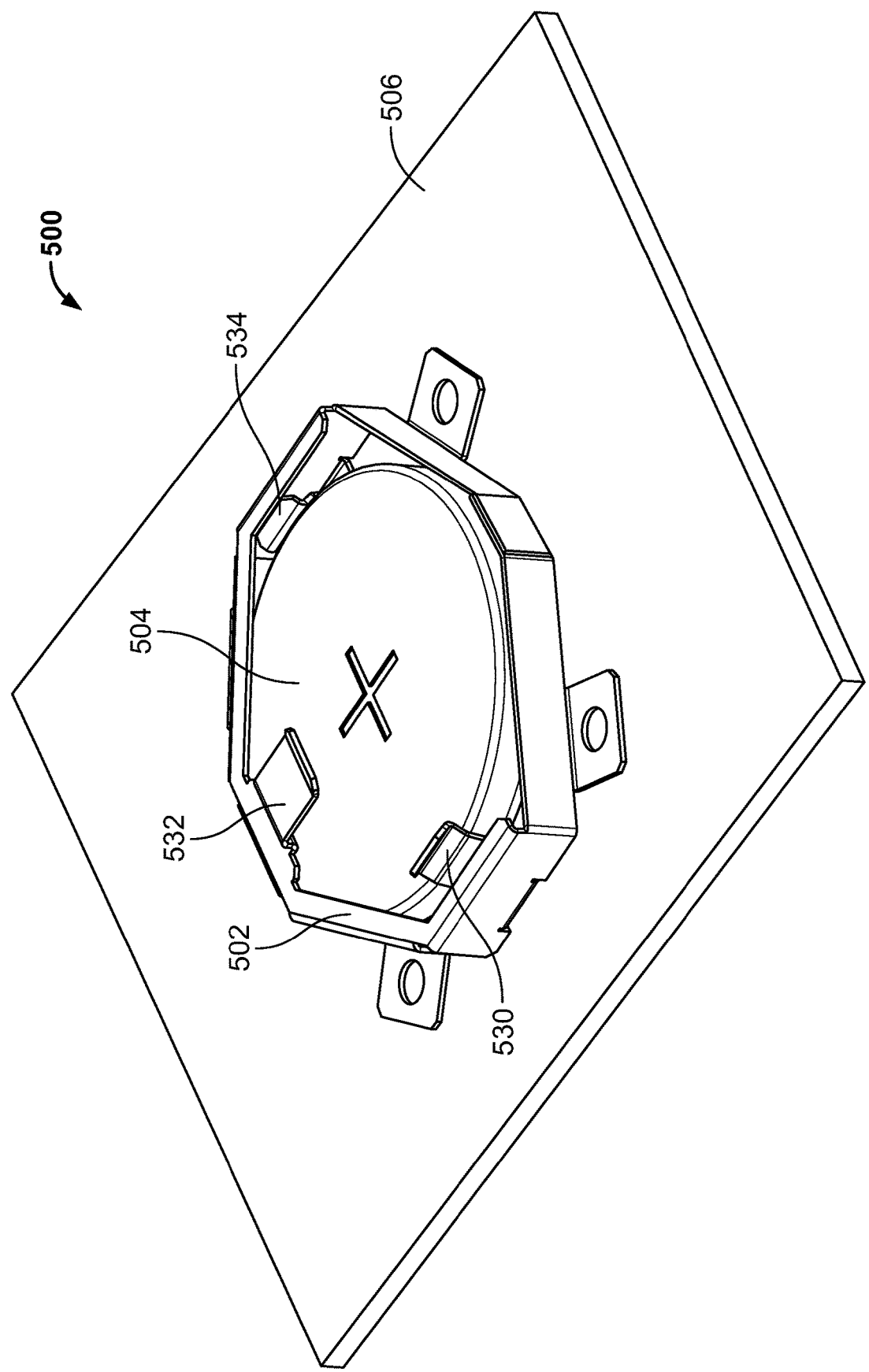
FIG. 11 is a perspective view of the top loading battery holder of FIG. 9 fixed to a circuit board with a battery arranged therein.

FIGS. 9-11 illustrate a fifth embodiment of a top loading battery holder 500. The top loading battery holder 500 includes a housing 502 that is shaped to entirely surround a battery 504 (e.g., coin cell battery). The housing 502, as shown in FIG. 11 is fastenable to a surface (e.g., a circuit board) 506 so that when the battery 504 is inserted into the housing 502, the housing 502 will be in direct contact with the surface 506.

The housing 502 includes a plurality of sidewalls that form a frame or cage to entirely surround the battery 504 when the battery 504 is arranged therein. As shown in FIGS. 9-11, the housing 502 includes a first sidewall 508, a second sidewall 510 that extends at an angle from the first sidewall 508, a third sidewall 512 that extends at an angle from the second sidewall 510, a fourth sidewall 514 that extends at an angle from the third sidewall 512, a fifth sidewall 516 that extends at an angle from the fourth sidewall 514, a sixth sidewall 518 that extends at an angle from the fifth sidewall 516, a seventh sidewall 522 that extends at an angle from the sixth sidewall 518, an eighth sidewall 522 that extends at an angle from the seventh sidewall 520 and a ninth sidewall 524 that extends at an angle from the eighth sidewall 522, overlaps and is contactable with the first sidewall 508. Although nine sidewalls are shown in FIGS. 9-11, the number of sidewalls and shape of the housing 502 can vary to include any number of sidewalls that form a shape that can secure a battery 504 within the periphery formed by the sidewalls and ensure the battery 504 is in direct contact with a surface 506 containing an electrical contact.

To aid in assembly (e.g., pick and place assembly) of the housing 502 to the surface 506, the housing includes a plurality of flanges 526 that each include an opening 528. The flanges 526 can, for example, be electronically connected or welded to the surface 506. In an embodiment, the surface 506 will have a negative conductivity and the housing 502 will provide positive conductivity for the battery 504.

The housing 502 can include a protrusion 527 that extend continuously about the housing 502 from a first end 529 of the housing 502 at the third sidewall 512 to a second end 531 at the seventh sidewall 520. To releasably secure the battery 504 within the housing 502, the battery holder 500, a first flange 530, a second flange 532 that is spaced from the first flange 530 and a third flange 534 that is spaced from the first flange 530 and second flange 532 extends from the housing 502 inwardly toward a center of the housing 502. The first flange 530 and the third flange 534, which are diametrically opposed to each other each include a first projection 538, 539, respectively, that extends from a second end 503 of the housing 502 inwardly toward the center of the housing 502, a second projection 540, 541, respectively, that extends upwardly from the first projection 538, 539, toward the protrusion 527, a third projection 542, 543, respectively, extending at an angle from the second projection 540, 541 toward the center of the housing 502 and over the battery 504 when the battery 504 is installed in the housing 502 and a fourth projection 544, 545, respectively, that extends from the third projection 542, 543 away from the center of the housing 502. The second flange 532 includes a first projection 548 that extends inwardly toward a center of the housing 502 and a second projection 550 that extends at an angle away from the housing 502.

Figure 12:
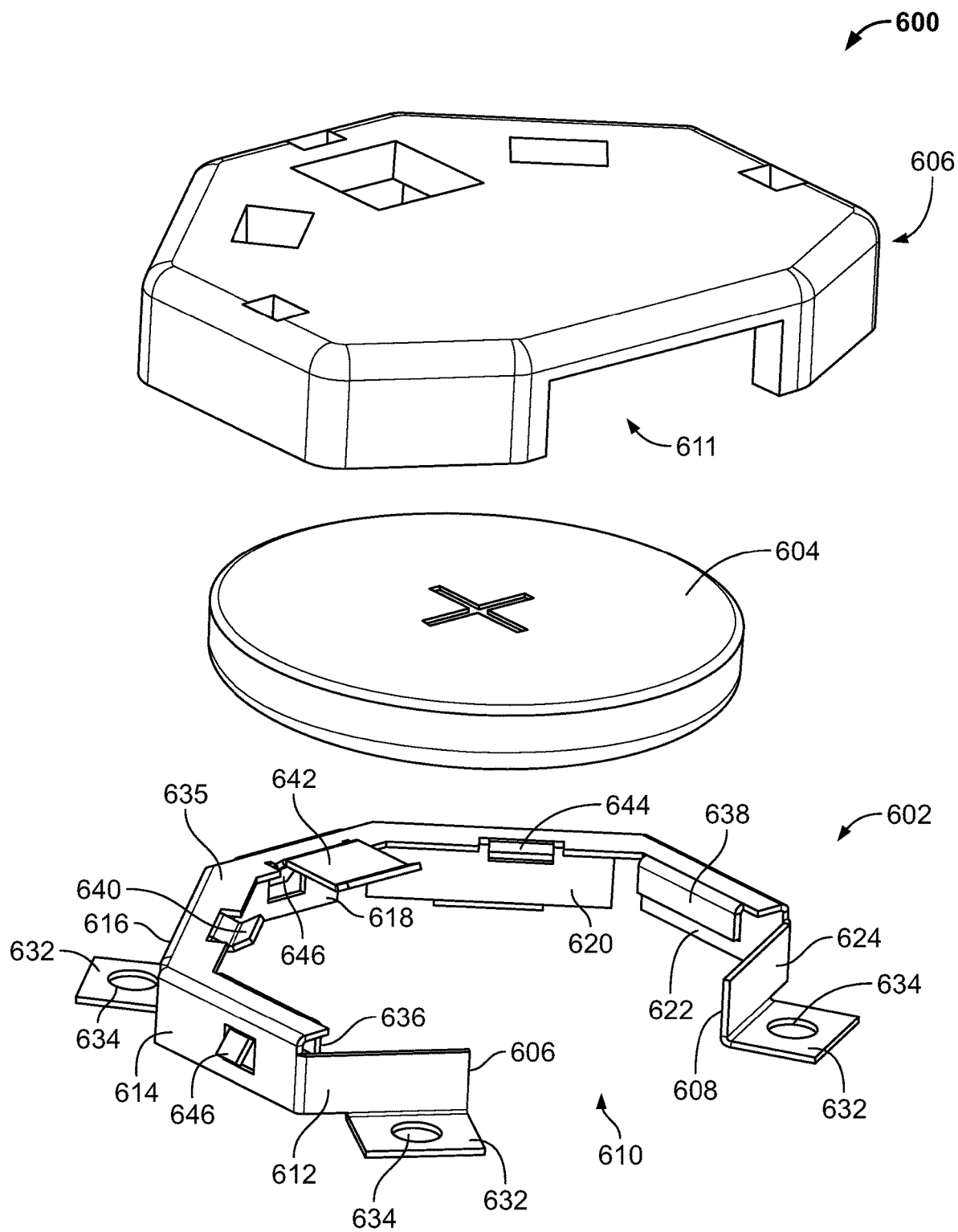
FIG. 12 is an assembly view of a sixth embodiment of a top loading battery holder.
Figure 15:
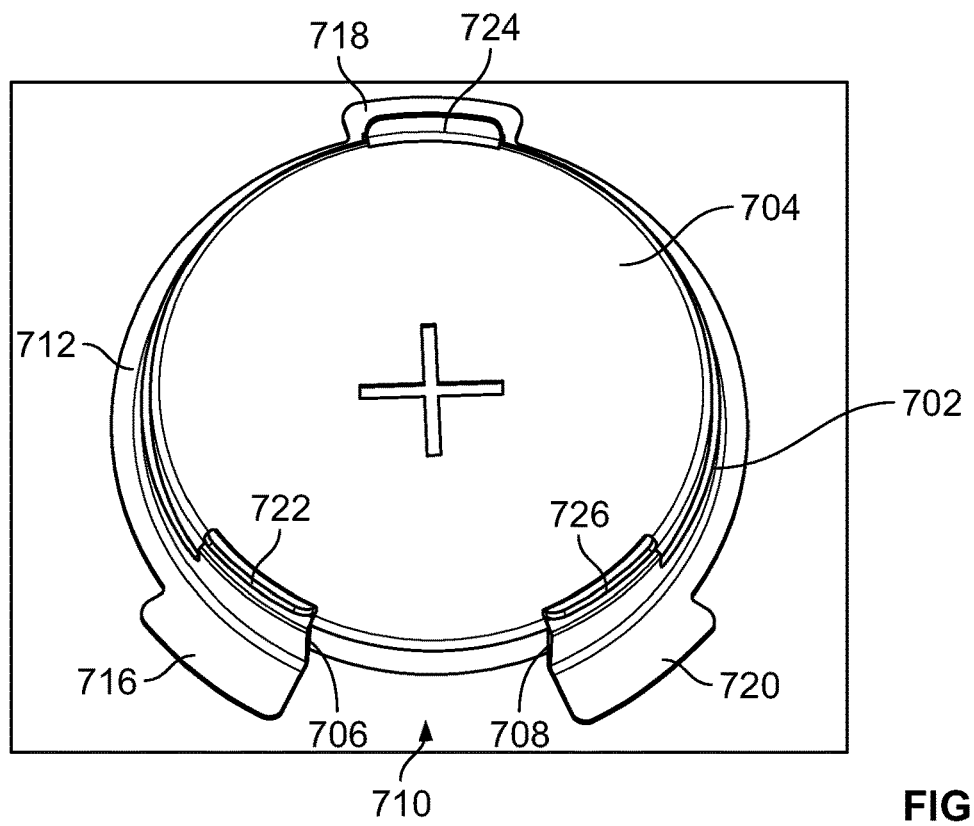
FIG. 15 is a second perspective view of the top loading battery holder of FIG. 13.
Figure 16:
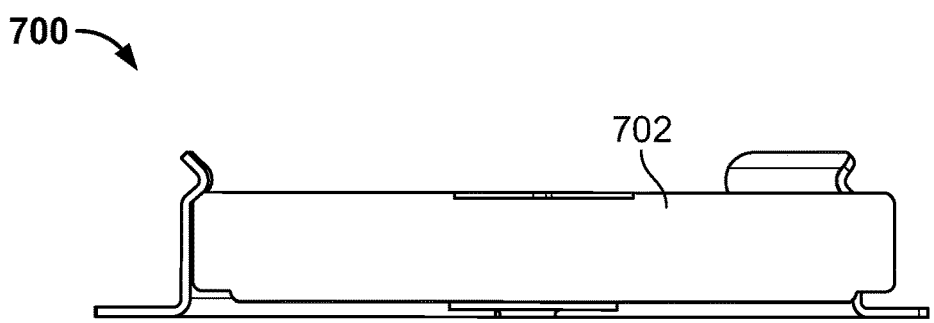
FIG. 16 is a cross-sectional view of the top loading battery holder of FIG. 13.
Figure 17:
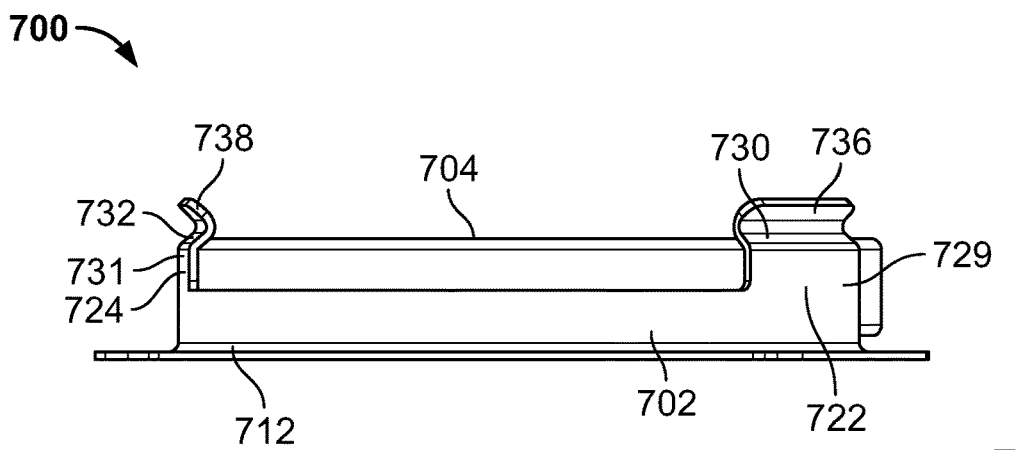
FIG. 17 is a side view of the top loading battery holder of FIG. 13.

FIG. 12 illustrates a sixth embodiment of a top loading battery designated hereinafter by reference numeral 600 that includes a housing 602 in which a battery 604 can be arranged and a covering element 606 substantially encompass the housing 602 and aid in securing the battery 604 within the housing 602 and in contact with a surface (e.g., a circuit board).

The housing 602 is delimited at first end 607 and a second end 608 with an opening 610 extending between the first end 607 and the second end 608 of the housing 602. Similar to the housing 602, the covering element 606 includes an opening 611 such that when the covering element 606 is arranged over the housing 602, the opening 610 of the housing 602 and the opening 611 of the covering element 606 are in alignment to allow for easy access within the battery holder 600. The housing 602 includes a first sidewall 612, a second sidewall 614, a third sidewall 616, a fourth sidewall 618, a fifth sidewall 620, a sixth sidewall 622 and a seventh sidewall 624 extending sequentially at various angles from each other to form a substantial octagonal shape and substantially surround the battery 604 with the battery 604 protruding between the first sidewall 612 and the seventh sidewall 624. However, although seven sidewalls are depicted in FIG. 12, the number of sidewalls and shape of the housing 602 can vary include any number of sidewalls and shape that would secure the battery 604 to a surface, such as a circuit board. To aid in connecting the housing 602 to a surface, the housing 602 includes a plurality of flanges or feet 632 that each have an opening 634 extending therethrough. As shown in FIG. 12, the flanges 632 extend from the first sidewall 612, the third sidewall 616, the fifth sidewall 620 and the seventh sidewall 624. The flanges 632 can, for example, be electronically connected or welded to the surface that can include a negative contact while the housing 602 can include a positive contact.

As shown in FIG. 12, a first projection 635 extends from a top end of the housing 602 from the second sidewall 614 through sixth sidewalls 622 inwardly toward a center of the housing 602. To aid in securing the battery 604 within the housing 602, like the housing 102 of the first embodiment, the housing 602 includes a second projection 636 that extends substantially perpendicular from the first projection 635 at the second sidewall 614 toward a first end of the second sidewall 614 and a third projection 638 extends substantially perpendicular from the first projection 635 at the sixth sidewall 622 toward a first end of the sixth sidewall 622. Additionally, the housing 602 includes a first flexible flange 640 that extends from the third sidewall 616, a second flexible flange 642 that extends from the fourth sidewall 618 and a third flexible tab 644 that extends from the fifth sidewall 620. Each of the second and third projections 636, 638 and the flanges 640, 642, 644 are elastically deformable to allow for the battery 604 is inserted and removed from the housing 602.

The housing 602 further includes a plurality of tabs 646 that extend outwardly at an angle from the second, fourth and sixth sidewalls 614, 618, 622, respectively, of the housing 602 that interact with the covering element 606 to secure the covering element 606 to the housing 602.

FIGS. 13-17 depict a seventh embodiment of a top loading battery holder 700. As shown in FIG. 13, the top loading battery holder 700 includes a substantially circular sidewall 702 that is contoured to extend substantially around an outer periphery of a circular battery 704 and a negative contact 703 fixed to a surface (i.e., circuit board) 705 within the periphery of the sidewall 702. The sidewall 702 extends between a first end 706 and a second end 708 thereof to define an opening 710 that allows for use of a small tool to life the battery 704 from the battery holder 700 when desired. A flange 712 extends substantially perpendicularly from a bottom end 714 of the sidewall 702 to stabilize the battery holder 700 and allow for the manufacture of the battery holder 700 as a one-piece element. A plurality of feet, or solder pads, 716, 718, 720 extend from the flange 712 to add further stability to the battery holder 700.

A plurality of flanges elastically deformable or snaps 722, 724, 726 are spaced from each other and extend from a top end 728 of the sidewall 702. As depicted, for example, in FIGS. 13 and 15, the flanges 722, 724, 726 extend from the sidewall 702 at about the first end 706 of the sidewall 702, the second end 708 of the sidewall 702 and at a location of the sidewall 702 that is approximately equidistant from the first end 706 and second end 708 of the sidewall 702. The position of the flanges 722, 724, 726 about the sidewall 702 allows for an adequate amount of space to insert the battery 704 using an individual's thumbs.

As can be seen in FIGS. 14-17, the flanges 722, 724, 726 are each comprised of a first protrusion 729, 731, 733, a first tab 730, 732, 734 and a second tab 736, 738, 740, respectively. The first tabs 730, 732, 734 are angled inwardly from the protrusions 729, 731, 733, respectively, toward the center of the battery holder 700 to hold the battery 704 at a releasably fixed position. The second tabs 730, 732, 734 extend from the first tabs 736, 738, 740, respectively, away from the center of the battery holder 700. In use, an individual can insert or remove the battery 704 by applying pressure to the flanges 722, 724, 726 to force the first tabs 730, 732, 734 and second tabs 736, 738, 740 to temporarily flex away from the sidewall 702 at an angle away from the sidewall 702.

The foregoing description and accompanying drawings illustrate principles, exemplary embodiments, and modes of operation of the present invention. However, the present invention should not be construed as being limited to the particular embodiments disclosed herein. Variations to the embodiments discussed above will be appreciated by those skilled in the art without departing from the scope of the invention. Accordingly, the above-described embodiments and accompanying drawings should be regarded as illustrative rather than restrictive.

What is claimed is:

1. A battery holder that is configured to be integrated with a circuit board, the battery holder comprising:
  a housing including at least one sidewall delimited between a first end and a second end that is configured to substantially surround a battery arranged therein; and
  a plurality of elastically deformable projections that each have a segment extending from the second end of the at least one sidewall of the housing in a first direction toward a center of the housing and contactable with the battery, when the battery is arranged in the housing, in order to secure the battery within the housing and another segment extending from a distal end of the segment in a second direction, away from the housing such that the plurality of elastically deformable projections extend in at least two directions.

2. The battery holder of claim 1, further comprising at least one further flexible projection that extends from the second end of the at least one sidewall toward the first end of the at least one sidewall and is deformable in a direction away from a center of the housing to aid in inserting and removing the battery within the housing.

3. The battery holder of claim 1, further comprising a flange extending from the second end of at least the sidewall of the housing toward a center of the housing that is configured to cover the battery at least partially when the battery is arranged within the housing with the plurality of elastically deformable projections extending from the flange.

4. The battery holder of claim 3, further comprising a flange disposed at a lower region of the housing to connect the housing to the circuit board.

5. The battery holder of claim 1, further comprising another one of the flanges of the plurality of flanges that extends upwardly from a base of the housing, is elastically deformable in a direction away from a center of the housing and is contactable with an outer circumference of the battery when the battery is arranged in the battery holder.

6. A battery holder that is configured to be integrated with a circuit board, the battery holder comprising:
  a housing including at least one sidewall delimited between a lower end and an upper end that is configured to substantially surround a battery arranged therein;
  a sidewall flange extending from the upper end of the sidewall;

a first projection extending downwardly from the sidewall flange toward the lower end of the at least one sidewall, the first projection being configured to contact an outer circumference of the battery when said battery is arranged therein; and a flexible flange extending from the sidewall flange toward the center of the housing, the flexible flange being configured to contact a top surface of the battery when arranged in the housing in order to secure the battery within the housing.

* * * * *